(12) United States Patent
Wang

(10) Patent No.: US 10,310,336 B2
(45) Date of Patent: Jun. 4, 2019

(54) ARRAY SUBSTRATE AND LIQUID CRYSTAL DISPLAY

(71) Applicant: Shenzhen China Star Optoelectronics Technology Co., Ltd., Shenzhen, Guangdong (CN)

(72) Inventor: Jinjie Wang, Guangdong (CN)

(73) Assignee: Shenzhen China Star Optoelectronics Technology Co., Ltd, Shenzhen, Guangdong (CN)

( * ) Notice: Subject to any disclaimer, the term of this patent is extended or adjusted under 35 U.S.C. 154(b) by 14 days.

(21) Appl. No.: 15/539,683

(22) PCT Filed: May 15, 2017

(86) PCT No.: PCT/CN2017/084391
§ 371 (c)(1),
(2) Date: Jun. 25, 2017

(87) PCT Pub. No.: WO2018/176591
PCT Pub. Date: Oct. 4, 2018

(65) Prior Publication Data
US 2018/0284547 A1    Oct. 4, 2018

(30) Foreign Application Priority Data

Mar. 31, 2017  (CN) .......................... 2017 1 0211319

(51) Int. Cl.
*H01L 27/12* (2006.01)
*G02F 1/1343* (2006.01)
*G02F 1/1362* (2006.01)

(52) U.S. Cl.
CPC .. *G02F 1/134309* (2013.01); *G02F 1/136286* (2013.01); *H01L 27/12* (2013.01); *G02F 2201/123* (2013.01)

(58) Field of Classification Search
CPC ......... G02F 1/134309; G02F 1/136286; G02F 2201/123; G02F 1/1343; G02F 1/13439;
(Continued)

(56) References Cited

U.S. PATENT DOCUMENTS

2003/0193625 A1* 10/2003 Yoshida ............ G02F 1/134336
349/43
2005/0036085 A1*  2/2005 Sunohara .......... G02F 1/133707
349/106
(Continued)

FOREIGN PATENT DOCUMENTS

CN      1452003 A    10/2003
CN    101878447 A    11/2010
(Continued)

*Primary Examiner* — Shan Liu
(74) *Attorney, Agent, or Firm* — Andrew C. Cheng

(57) ABSTRACT

The present invention provides an array substrate, comprising a plurality of pixel electrodes arranged in array, and each pixel electrode comprises a first pixel region and a second pixel region connected to the first pixel region, and the first electrode region comprises a first peripheral electrode and four first sub regions, each having a plurality of first branch electrodes, and the first branch electrodes are obliquely disposed and have an angle to the first peripheral electrode; the second pixel region comprises a second peripheral electrode and four second sub regions, each having a plurality of second branch electrodes, and in the four second sub regions, the second branch electrodes in two second sub regions are arranged horizontally, and the second branch electrodes in the other two second sub regions are arranged vertically.

12 Claims, 1 Drawing Sheet

(58) Field of Classification Search
CPC ...... G02F 1/155; G02F 1/1393; G02F 1/1395; G02F 1/136; G02F 1/218; G02F 1/134363; G02F 1/134327; G02F 1/133707; G02F 1/134336; G02F 1/0316; G02F 2001/134318; G02F 2001/134372; G02F 2001/134381; G02F 2001/134345; G02F 2001/1357; G02F 2001/136218; G02F 2001/136295; G02F 2001/1552; G02F 2001/1555; G02F 2001/1557; G02F 2001/13629; G02F 2201/12; G02F 2201/121; G02F 2201/124; G02F 2201/122; G02F 2201/14; G02F 2202/10; G02F 1/133753; G02F 1/3775; G02F 1/1362; G02F 1/136209; G02F 1/136227; G02F 1/1365; G02F 1/1368; G02F 2001/136222; G02F 2001/136231; G02F 2001/13625; G02F 2001/1635; H01L 27/12; H01L 27/124; H01L 27/3276; H01L 27/3297; H01L 27/3279; H01L 27/329; H01L 23/49534; H01L 2933/0016; H01L 2021/775; H01L 27/1214; H01L 27/2436; H01L 29/66037; H01L 29/66068; H01L 29/66227; H01L 29/72; H01L 29/786; H01L 2924/1304; H01L 51/0504; H01L 51/0508; G09G 2300/0421; G09G 2300/0426; G09G 2300/0439; G09G 3/3659
USPC ............................ 349/139–148, 129, 42–43
See application file for complete search history.

(56) References Cited

U.S. PATENT DOCUMENTS

| 2010/0123845 | A1* | 5/2010 | Kim | H01L 27/124 349/46 |
| 2011/0164206 | A1* | 7/2011 | Fan | G02F 1/133753 349/96 |
| 2012/0119215 | A1* | 5/2012 | You | G02F 1/133707 257/59 |
| 2014/0204326 | A1* | 7/2014 | Wu | G02F 1/133707 349/143 |
| 2015/0070632 | A1* | 3/2015 | Kang | G02F 1/13363 349/96 |
| 2016/0154280 | A1* | 6/2016 | Yang | G02F 1/134309 349/96 |
| 2018/0107079 | A1* | 4/2018 | Tae | G02F 1/136277 |

FOREIGN PATENT DOCUMENTS

| CN | 103226271 A | 7/2013 |
| CN | 105182631 A | 12/2015 |

* cited by examiner

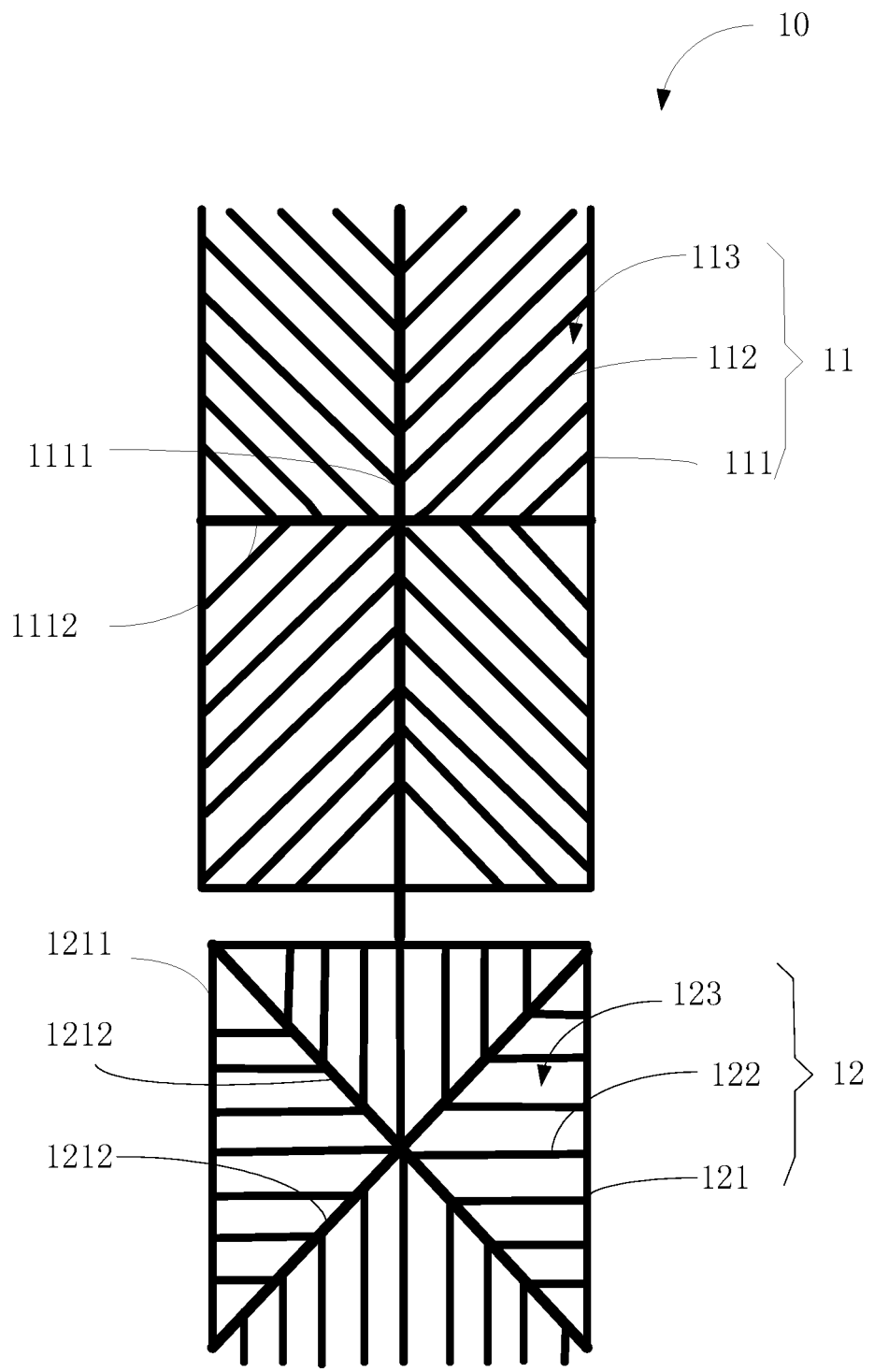

ARRAY SUBSTRATE AND LIQUID CRYSTAL DISPLAY

CROSS REFERENCE

This application claims the priority of Chinese Patent Application No. 201710211319.2, entitled "Array substrate and liquid crystal display", filed on Mar. 31, 2017, the disclosure of which is incorporated herein by reference in its entirety.

FIELD OF THE INVENTION

The present invention relates to a touch panel technology field, and more particularly to an array substrate and a liquid crystal display.

BACKGROUND OF THE INVENTION

The common large size Liquid crystal display panel uses the design of 4 pixel domains. The sub electrodes are arranged at an angle of 45 degrees to the vertical direction. Such arrangement of pixel electrodes causes the liquid crystal to be aligned at an oblique angle of 45 degrees, and such arrangement of the liquid crystal will make the brightness of the oblique direction and the brightness of horizontal/vertical direction are inconsistent to result in the differences in the viewing angle, and the more obvious brightness difference among various angles.

SUMMARY OF THE INVENTION

The present invention provides an array substrate and a liquid crystal display which can reduce difference in viewing angle brightness.

The array substrate of the present application comprises a plurality of pixel electrodes arranged in array, and each pixel electrode comprises a first pixel region and a second pixel region connected to the first pixel region, and the first electrode region comprises a first peripheral electrode and four first sub regions, each having a plurality of first branch electrodes, and the first branch electrodes are obliquely disposed and have an angle to the first peripheral electrode; the second pixel region comprises a second peripheral electrode and four second sub regions, each having a plurality of second branch electrodes, and in the four second sub regions, the second branch electrodes in two second sub regions are arranged horizontally, and the second branch electrodes in the other two second sub regions are arranged vertically.

The second peripheral electrode comprises two main electrodes, and the two main electrodes are arranged on two diagonal lines of the second peripheral electrode and are orthogonally crossed, and the two main electrodes and the second peripheral electrode form the four second sub regions, and the second branch electrodes in each second sub region are perpendicular to the second peripheral electrode, which constitute the second sub region.

The first electrode region comprises a vertical main electrode and a horizontal main electrode, which are orthogonally crossed in the first peripheral electrode, and the vertical main electrode and the horizontal main electrode are crossed to form the four first sub regions, and the first branch electrodes are distributed in each of the first sub regions and have an angle to the vertical main electrode or the horizontal main electrode.

The vertical main electrode extends to an outside of the first peripheral electrode and is connected to the second peripheral electrode.

The first electrode region and the second electrode region are connected by a peripheral trace.

The first branch electrodes are set at an angle of ±45 degrees or ±135 degrees with the horizontal main electrode or the vertical main electrode; the second branch electrodes are set at ±45 degrees with the two main electrodes.

The first peripheral electrode and the second peripheral electrode are rectangular frame structures.

Gaps among the plurality of second branch electrodes in each of the second sub regions are different from gaps among the plurality of first branch electrodes in each of the first sub regions.

A width of the first branch electrodes is different from a width of the second branch electrodes.

The liquid crystal display provided by the present invention comprises the array substrate, a color film substrate and a liquid crystal layer sandwiched between the array substrate and the color film substrate.

The pixel electrodes of the array substrate of the present application are provided with two different arrangements of electrode regions, which can reduce the brightness difference and improve the color shift phenomenon.

BRIEF DESCRIPTION OF THE DRAWINGS

The structural features and effects of the present invention will be more clearly described, which will now be described in detail with reference to the accompanying drawings and specific embodiments.

FIG. 1 is a top view diagram of a pixel electrode of an array substrate according to the present invention.

DETAILED DESCRIPTION OF PREFERRED EMBODIMENTS

For better explaining the technical solution and the effect of the present invention, the present invention will be further described in detail with the accompanying drawings in the specific embodiments. The figures are for illustrative purposes only and are illustrative only but not to be construed as limiting the present application.

The present invention provides a liquid crystal display and an array substrate. The liquid crystal display comprises the array substrate, a color film substrate and a liquid crystal layer sandwiched between the array substrate and the color film substrate. Please refer to FIG. 1. The array substrate provided by the present invention comprises a plurality of pixel electrodes 10 arranged in array. The plurality of pixel electrodes 10 are located on a substrate of the array substrate and connected to source lines. Each pixel electrode 10 comprises a first pixel region 11 and a second pixel region 12 connected to the first pixel region 11, and the first electrode region 11 comprises a first peripheral electrode 111 and four first sub regions 113, each having a plurality of first branch electrodes 112, and the first branch electrodes 112 are obliquely disposed and have an angle to the first peripheral electrode 111. The second pixel region 12 comprises a second peripheral electrode 121 and four second sub regions 123, each having a plurality of second branch electrodes 122, and in the four second sub regions 123, the second branch electrodes 122 in two second sub regions 123 are arranged horizontally, and the second branch electrodes 122 in the other two second sub regions 123 are arranged vertically.

In this embodiment, the pixel electrode 10 is a rectangular structure. The first electrode region 11 and the second electrode region 12 are rectangular. As shown in the FIGURE, the first electrode region 11 is above the second electrode region 12. The second peripheral electrode 121 is a rectangular frame structure and comprises a frame 1211 and two main electrodes 1212. The two main electrodes 1212 are arranged on two diagonal lines of the second peripheral electrode 121 and are orthogonally crossed. The two main electrodes 1212 and the second peripheral electrode 121 form the four second sub regions 123, and the second branch electrodes 122 in each second sub region 123 are perpendicular to the second peripheral electrode 121, which constitute the second sub region. The second branch electrodes 122 in two second sub regions 123 which are opposite are arranged horizontally. Namely, the second branch electrodes 122 are perpendicular to the second peripheral electrode 121, which constitute the second sub region 123. In this embodiment, the second branch electrodes 122 are perpendicular to a vertical portion of the frame 1211 of the second peripheral electrode. Besides, the second branch electrodes 122 in the other two second sub regions 123 which are opposite are arranged vertically. Namely, the second branch electrodes 122 are perpendicular to the second peripheral electrode 121, which constitute the second sub region 123. In this embodiment, the second branch electrodes 122 are perpendicular to a horizontal portion of the frame 1211 of the second peripheral electrode. All the second branch electrodes 122 are arranged at an angle with the main electrode electrodes 1212, which are set at ±45 degrees in this embodiment.

In this embodiment, the first electrode region 11 comprises a vertical main electrode 1111 and a horizontal main electrode 1112, which are orthogonally crossed in the first peripheral electrode 111, and the vertical main electrode 1111 and the horizontal main electrode 1112 are crossed to form the four first sub regions 113, and the first branch electrodes 112 are distributed in each of the first sub regions 113 and have an angle to the vertical main electrode 1111 or the horizontal main electrode 1112. The first branch electrodes 112 are set at an angle of ±45 degrees or ±135 degrees with the horizontal main electrode 1111 or the vertical main electrode 1112.

Furthermore, the vertical main electrode 1111 extends to an outside of the first peripheral electrode 111 and is connected to the second peripheral electrode 121. In other embodiments, the first electrode region 11 and the second electrode region 12 are connected by a peripheral trace. For instance, an extension line of the horizontal main electrode 1112 in the first peripheral electrode 111, an extension line of the main electrode 1212 of the second peripheral electrode 121 or an external trace can be illustrated.

Furthermore, gaps among the plurality of second branch electrodes 122 in each of the second sub regions 123 are different from gaps among the plurality of first branch electrodes 112 in each of the first sub regions 113. A width of the first branch electrodes 112 is different from a width of the second branch electrodes 122. Thus, the twist angles of the liquid crystals will have difference to achieve low color shift function. Certainly, the gaps among the plurality of second branch electrodes 122 can be equal to the gaps among the plurality of first branch electrodes 112 according to design needs. A width of the first branch electrodes 112 is equal to a width of the second branch electrodes 122.

In the array substrate of the present invention, each pixel electrode is divided into two parts. A portion of the branch electrodes are arranged horizontally and vertically so that the liquid crystal molecules in the pixels can be arranged more than the angle of 45 degrees but additionally with the vertical direction and horizontal direction. Accordingly, the liquid crystal molecule long axis can be seen in various angles to greatly increase the viewing angle.

Above are only specific embodiments of the present invention, the scope of the present invention is not limited to this, and to any persons who are skilled in the art, change or replacement which is easily derived should be covered by the protected scope of the invention. Thus, the protected scope of the invention should go by the subject claims.

What is claimed is:

1. An array substrate, comprising a plurality of pixel electrodes arranged in array, wherein each pixel electrode comprises a first pixel region and a second pixel region connected to the first pixel region, and the first pixel region comprises a first peripheral electrode and four first sub regions, each having a plurality of first branch electrodes, and the first branch electrodes are obliquely disposed and have an angle to the first peripheral electrode; the second pixel region comprises a second peripheral electrode and four second sub regions, each having a plurality of second branch electrodes, and in the four second sub regions, the second branch electrodes in two second sub regions are arranged horizontally, and the second branch electrodes in the other two second sub regions are arranged vertically, wherein gaps among the plurality of second branch electrodes in each of the second sub regions are different from gaps among the plurality of first branch electrodes in each of the first sub regions, so that twist angles of liquid crystals in a liquid crystal layer of a liquid crystal display having the array substrate have difference to achieve low color shift;

the second peripheral electrode comprises two main electrodes, and the two main electrodes are arranged on two diagonal lines of the second peripheral electrode and are orthogonally crossed, and the two main electrodes and the second peripheral electrode form the four second sub regions, and the second branch electrodes in each second sub region are perpendicular to the second peripheral electrode, which constitute the second sub region;

the first pixel region comprises a vertical main electrode and a horizontal main electrode, which are orthogonally crossed in the first peripheral electrode, and the vertical main electrode and the horizontal main electrode are crossed to form the four first sub regions, and the first branch electrodes are distributed in each of the first sub regions and have an angle to the vertical main electrode or the horizontal main electrode; and the vertical main electrode of the first pixel region is arranged in a vertical straight line with at least one of the second branch electrodes arranged vertically in the other two second sub regions in a plan view.

2. The array substrate according to claim 1, wherein the vertical main electrode extends to an outside of the first peripheral electrode and is connected to the second peripheral electrode of the second pixel region.

3. The array substrate according to claim 1, wherein the first pixel region and the second pixel region are connected by a peripheral trace.

4. The array substrate according to claim 1, wherein the first branch electrodes are set at an angle of +45 degrees or ±135 degrees with the horizontal main electrode or the vertical main electrode; the second branch electrodes are set at +45 degrees with the two main electrodes.

5. The array substrate according to claim 4, wherein the first peripheral electrode and the second peripheral electrode are rectangular frame structures.

6. The array substrate according to claim 1, wherein a width of the first branch electrodes is different from a width of the second branch electrodes.

7. A liquid crystal display, comprising an array substrate, a color filter substrate and a liquid crystal layer sandwiched between the array substrate and the color filter substrate, and the array substrate comprising a plurality of pixel electrodes arranged in array, wherein each pixel electrode comprises a first pixel region and a second pixel region connected to the first pixel region, and the first pixel region comprises a first peripheral electrode and four first sub regions, each having a plurality of first branch electrodes, and the first branch electrodes are obliquely disposed and have an angle to the first peripheral electrode; the second pixel region comprises a second peripheral electrode and four second sub regions, each having a plurality of second branch electrodes, and in the four second sub regions, the second branch electrodes in two second sub regions are arranged horizontally, and the second branch electrodes in the other two second sub regions are arranged vertically, wherein gaps among the plurality of second branch electrodes in each of the second sub regions are different from gaps among the plurality of first branch electrodes in each of the first sub regions, so that twist angles of liquid crystals in the liquid crystal layer sandwiched between the array substrate and the color filter substrate of the liquid crystal display have difference to achieve low color shift;

the second peripheral electrode comprises two main electrodes, and the two main electrodes are arranged on two diagonal lines of the second peripheral electrode and are orthogonally crossed, and the two main electrodes and the second peripheral electrode form the four second sub regions, and the second branch electrodes in each second sub region are perpendicular to the second peripheral electrode, which constitute the second sub region;

the first pixel region comprises a vertical main electrode and a horizontal main electrode, which are orthogonally crossed in the first peripheral electrode, and the vertical main electrode and the horizontal main electrode are crossed to form the four first sub regions, and the first branch electrodes are distributed in each of the first sub regions and have an angle to the vertical main electrode or the horizontal main electrode; and the vertical main electrode of the first pixel region is arranged in a vertical straight line with at least one of the second branch electrodes arranged vertically in the other two second sub regions in a plan view.

8. The liquid crystal display according to claim 7, wherein the vertical main electrode extends to an outside of the first peripheral electrode and is connected to the second peripheral electrode of the second pixel region.

9. The liquid crystal display according to claim 7, wherein the first pixel region and the second pixel region are connected by a peripheral trace.

10. The liquid crystal display according to claim 7, wherein the first branch electrodes are set at an angle of ±45 degrees or ±135 degrees with the horizontal main electrode or the vertical main electrode; the second branch electrodes are set at +45 degrees with the two main electrodes.

11. The liquid crystal display according to claim 10, wherein the first peripheral electrode and the second peripheral electrode are rectangular frame structures.

12. The liquid crystal display according to claim 7, wherein a width of the first branch electrodes is different from a width of the second branch electrodes.

* * * * *